United States Patent
Cheng (10) Patent No.: US 7,323,657 B2
(45) Date of Patent: *Jan. 29, 2008

(54) PRECISION MACHINING METHOD USING A NEAR-FIELD SCANNING OPTICAL MICROSCOPE

(75) Inventor: Chen-Hsiung Cheng, Westford, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 179 days.

This patent is subject to a terminal disclaimer.

(21) Appl. No.: 10/911,071

(22) Filed: Aug. 3, 2004

(65) Prior Publication Data

US 2006/0027543 A1 Feb. 9, 2006

(51) Int. Cl.
*B23K 26/38* (2006.01)
*B23K 26/03* (2006.01)
*G02B 7/04* (2006.01)

(52) U.S. Cl. ............... 219/121.69; 250/201.3; 977/851

(58) Field of Classification Search ........... 219/121.68, 219/121.69, 121.83; 250/201.3, 306; 438/7, 438/16; 977/851
See application file for complete search history.

(56) References Cited

U.S. PATENT DOCUMENTS

| 6,337,479 | B1 * | 1/2002 | Kley | 250/307 |
| 6,621,060 | B1 * | 9/2003 | Nantel et al. | 250/201.4 |
| 7,053,351 | B2 * | 5/2006 | Li et al. | 250/201.3 |
| 7,151,244 | B2 * | 12/2006 | Cheng et al. | 250/201.3 |
| 2004/0222197 | A1 * | 11/2004 | Hiramatsu | 219/121.7 |
| 2005/0221577 | A1 * | 10/2005 | Li et al. | 438/401 |

FOREIGN PATENT DOCUMENTS

| GB | 2400063 A * | 10/2004 |
| JP | 11-16856 | 1/1999 |
| JP | 2001-111200 A | 4/2001 |
| JP | 2001-239390 A | 9/2001 |
| JP | 2002-307176 A * | 10/2002 |
| WO | WO-01/03157 A1 * | 1/2001 |

OTHER PUBLICATIONS

A. Chimmalgi et al., Femtosecond laser aperturless near-field nanomaching of metals assisted by scanning probe microscopy, Applied Physics Letters, Feb. 24, 2003, pp. 1146-1148, vol. 82, No. 8.
K. Lieberman et al., Near-field optical photomask repair with a femtosecond laser, Journal of Microscopy, May/Jun. 1999, pp. 537-541, vol. 194, Pt. 2/3.

* cited by examiner

*Primary Examiner*—Geoffrey S. Evans
(74) *Attorney, Agent, or Firm*—RatnerPrestia (57) ABSTRACT

A method for manufacturing a microstructure device using a near field scanning optical microscope (NSOM) laser micromachining system. A microstructure device preform, including an existing feature, is provided. The NSOM probe tip is scanned over a portion of the preform selected such that a plurality of scan lines cross the existing feature. Scanned locations of the existing feature in at least two scan lines are determined. The orientation of the existing feature is determined based on the scanned locations and the shape of the existing feature. At least one expected machining location in a subsequent scan line is determined based on the shape and orientation of the existing feature. The micromachining laser is pulsed as the NSOM probe is scanned through the expected machining location(s) during the subsequent scan lines to form at least one fine feature on the microstructure device preform, thus, completing the microstructure device.

31 Claims, 7 Drawing Sheets

PRECISION MACHINING METHOD USING A NEAR-FIELD SCANNING OPTICAL MICROSCOPE

FIELD OF THE INVENTION

The present invention concerns a method for precision laser machining of microstructures, including nanostructures, using a near-field scanning optical microscope (NSOM). This method may also allow mass customization or repair of generic electronic and mechanical microstructures.

BACKGROUND OF THE INVENTION

As products get smaller and smaller, there is increased demand for micro-electrical-mechanical systems (MEMS), micro-optical devices and photonic crystals. With this demand, there is an associated increased interest in micro- and nano-machining. Numerous applications exist for MEMS. As a breakthrough technology, allowing unparalleled synergy between previously unrelated fields such as biology and microelectronics, new MEMS applications are emerging at a rapid pace, expanding beyond those currently identified or known. Additional applications in quantum electric devices, micro-optical devices and photonic crystals are also emerging.

Here are a few applications of current interest:

Quantum Electrical Devices

Interest in ideas such as quantum computing have led to the development of devices requiring increasing smaller dimensions, such as cellular automata and coupled quantum dot technologies. Resonant tunneling devices such as resonant tunneling diodes, which may utilize quantum effects of transmission electrons to increase the efficiency of microwave circuits, require particularly fine features.

Micro-Optics

The application of micro-machining techniques to optics has lead to numerous advances in optical fabrication such as gray scale technology. Gray scale technology allows for the creation of a wide variety of shapes allowing for the best optical performance achievable. Traditional binary optics rely on a "stair step" shaped approximation of the ideal surface shape. Gray scale can actually create that ideal shape. Curves, ramps, torroids, or any other shape is possible. Multi-function optics, microlens arrays, diffusers, beam splitters, and laser diode correctors may all benefit from the use of gray scale technology. These optical devices as well as others, including fine pitch gratings for shorter and shorter wavelength light, benefit from increased precision available using micro-machining. Optical MEMS devices including beam shapers, continuous membrane deformable mirrors, moving mirrors for tunable lasers, and scanning two axis tilt mirrors have also emerged due to progress in micro-machining technology.

Photonic Crystals

Photonic crystals represent an artificial form of optical material that may be used to create optical devices with unique properties. Photonic crystals have many optical properties that are analogous to the electrical properties of semiconductor crystals and, thus, may also allow the development of optical circuitry similar to present electrical semiconductor circuitry. The feature sizes used to form photonic crystals and the precise alignment requirements of these features complicate manufacture of these materials. Improved alignment techniques and reduced minimum feature size capabilities for micro-machining systems may lead to further developments in this area.

Biotechnology

MEMS technology has enabling new discoveries in science and engineering such as: polymerase chain reaction (PCR) microsystems for DNA amplification and identification; micro-machined scanning tunneling microscope (STM) probe tips; biochips for detection of hazardous chemical and biological agents; and microsystems for high-throughput drug screening and selection.

Communications

In addition to advances that may result from the use of resonant tunneling devices, high frequency circuits may benefit considerably from the advent of RF-MEMS technology. Electrical components such as inductors and tunable capacitors made using MEMS technology may perform significantly better than their present integrated circuit counterparts. With the integration of such components, the performance of communication circuits may be improved, while the total circuit area, power consumption and cost may be reduced. In addition, a MEMS mechanical switch, as developed by several research groups, may be a key component with huge potential in various microwave circuits. The demonstrated samples of MEMS mechanical switches have quality factors much higher than anything previously available. Reliability, precise tuning, and packaging of RF-MEMS components are to be critical issues that need to be solved before they receive wider acceptance by the market.

Advances in micro-optics and the introduction of new optical devices using photonic crystals may also benefit communications technology.

Accelerometers

MEMS accelerometers are quickly replacing conventional accelerometers for crash air-bag deployment systems in automobiles. The conventional approach uses several bulky accelerometers made of discrete components mounted in the front of the car with separate electronics near the air-bag. MEMS technology has made it possible to integrate the accelerometer and electronics onto a single silicon chip at a cost of $\frac{1}{5}$ to $\frac{1}{10}$ of the cost of the conventional approach. These MEMS accelerometers are much smaller, more functional, lighter, and more reliable as well, compared to the conventional macro-scale accelerometer elements.

Micro-Circuitry

Reducing the size of electronic circuits is another area in which MEMS technology may affect many fields. As the density of components and connections increases in these microcircuits, the processing tolerances decrease. One challenge in producing micro-circuitry is preventing shorts between components and nano-wires which are located ever closer together. Yields may be significantly increased by micromachining methods with the capability to repair these defects.

This illustrates one particular challenge in micro-machining, namely, how to accurately add fine features to existing micro- or nano-structures (i.e. where the work piece already has complicated microstructures), particularly in an efficient manner. Micromachining of submicron features has been a domain predominated by electron-beam, ultraviolet beam, and X-ray lithographic machines, as well as focused ion beam machines. These high-cost techniques usually require stringent environmental conditions, such as high vacuum or clean room conditions. All the lithographic methods require a series of complicated procedures, which involve generating multiple masks and using photoresist. If a beam processing technique is used, this process requires the beam to be directed accurately at the desired location with a high degree of precision for proper processing. Only four currently available technologies (laser direct writing, focused ion beam writing, micro electric discharge machine, and photochemical etching) have this potential capability. Other techniques (for example ion beam milling) are only desirable for flat wafer processing. However, direct laser writing has additional advantages, including operation in ambient air and low materials dependence.

The emergence of ultrafast lasers makes submicron-level direct writing possible. In late 1999 and early 2000, the capability of femtosecond laser with a UV wavelength of 387 nm to machine ~200 nm air holes with pitch size of ~420 nm in plain Si-on-SiO$_2$ substrate was demonstrated. This demonstration met both the feature size (<200 nm) and pitch size (<420 nm) requirements for a 1D waveguide photonic crystal. The next step was to study drilling small holes on narrow waveguides to make a 1D photonic crystal. Ultrafast lasers have proven to be very versatile tools for micro-, nano-machining. Feature sizes as small as ~150 nm have now been demonstrated using ultrafast laser beam machining. Still alignment of a laser beam to nanostructures on existing microstructures is a difficult issue.

Laser machining of surfaces using the near-field radiation of a near-field scanning optical microscope (NSOM), sometimes also known as scanning near-field optical microscope (SNOM), has been proposed as a means of laser machining submicron features. One potential method for micromachining surfaces in this way is disclosed in Japanese Patent Application 2000-51975, LASER MACHINING APPARATUS AND ITS METHOD AND AN OPTICAL ELEMENT MACHINED BY USING SAME, to H. Owari, et al. Owari, et al. disclose using light from a short-wavelength ultraviolet laser that is transmitted through the probe of an atomic force microscope to laser machine an optical grating. Unlike the present invention, this method does not, however, provide a quick and efficient method to mass produce such microstructures.

SUMMARY OF THE INVENTION

An exemplary embodiment of the present invention is a method for manufacturing a microstructure device using a near field scanning optical microscope (NSOM) laser micromachining system that includes an NSOM and a micromachining laser. A microstructure device preform, including an existing feature having a predetermined shape on its top surface, is provided. The probe tip of the NSOM is scanned over a portion of the top surface of the microstructure device preform. This portion of the top surface is selected such that a plurality of scan lines cross the existing feature. Scanned locations of the existing feature in at least two of the scan lines are determined. Then orientation of the existing feature of the top surface of the microstructure device preform is then determined based on the scanned locations and the predetermined shape of the existing feature. At least one expected machining location in at least one subsequent scan line is determined based on the predetermined shape and the determined orientation of the existing feature. The expected machining location(s) correspond(s) to a fine feature portion of the top surface of the microstructure device preform. The micro-machining laser is pulsed as the NSOM probe is scanned through the expected machining location(s) during the subsequent scan lines to machine the fine feature portion of the top surface of the microstructure device preform and form at least one fine feature on the top surface of the microstructure device preform, thus, completing the microstructure device.

Another exemplary embodiment of the present invention is a method for mass customizing a plurality of microstructures with a near field scanning optical microscope (NSOM) laser micromachining system that includes an NSOM and a micro-machining laser. Each of the microstructures is customized to have at least one of a plurality of customization features. The plurality of microstructure preforms, each including a top surface with an existing feature having a predetermined shape, are provided. A microstructure preform is selected, as is at least one of the customization features to be formed on the selected preform, and the selected microstructure preform is mounted in the NSOM. The probe tip of the NSOM is scanned over a portion of the top surface of the selected microstructure preform. This portion of the top surface is selected such that a plurality of scan lines cross the existing feature. Scanned locations of the existing feature in at least two of the scan lines are determined. The orientation of the existing feature of the top surface of the selected microstructure preform is then determined based on the scanned locations and the predetermined shape of the existing feature. At least one expected machining location in at least one subsequent scan line is determined based on the predetermined shape and the determined orientation of the existing feature. The expected machining location(s) correspond(s) to the location of the selected customization feature on the top surface of the selected microstructure preform. The micro-machining laser is pulsed as the NSOM probe is scanned through the expected machining location(s) during the subsequent scan lines. This machines the fine feature portion of the top surface of the selected microstructure preform to form the selected customization feature on the selected microstructure preform, thus, customizing the microstructure device. Another microstructure preform and associated customization feature are selected and the customization process is repeated for each of the plurality of microstructure preforms provided.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION OF THE INVENTION

NSOMs use many of the same principles as atomic force microscopes (AFMs) to accurately profile surfaces. Laser micromachining of these surfaces using near-field radiation from an NSOM probe tip may provide a number of advantages compared to using non-near-field radiation and free space optics. The advantages may include precise positioning control of the NSOM probe tip and a reduced minimum feature size. The precise motion stages used in NSOM devices may be used to provide precise horizontal (X and Y) and vertical (Z) positioning control. Additionally, the ability of an NSOM to profile a surface allows for the accurate vertical positioning of the probe tip desired to couple significant near-field radiation to the surface.

The minimal feature size that may be machined with an exemplary NSOM laser machining system of the present invention using near-field radiation is determined by the size and shape geometry of the NSOM probe tip, rather than by the wavelength of the laser light used to generate the near-field radiation. This may allow a laser machining apparatus to machine areas on a surface, which are smaller than the diffraction limited spot size of a free space laser beam from the same laser source. The wavelength of the laser is still an issue, though, because it affects the efficiency with which the light may be coupled into the near-field through the NSOM probe tip. Thus, the use of short wavelength UV lasers with wavelengths may still be desirable, but not as critical as in laser micro-machining systems using non-near-field radiation, and free space optics to focus the laser light.

Figure 1:
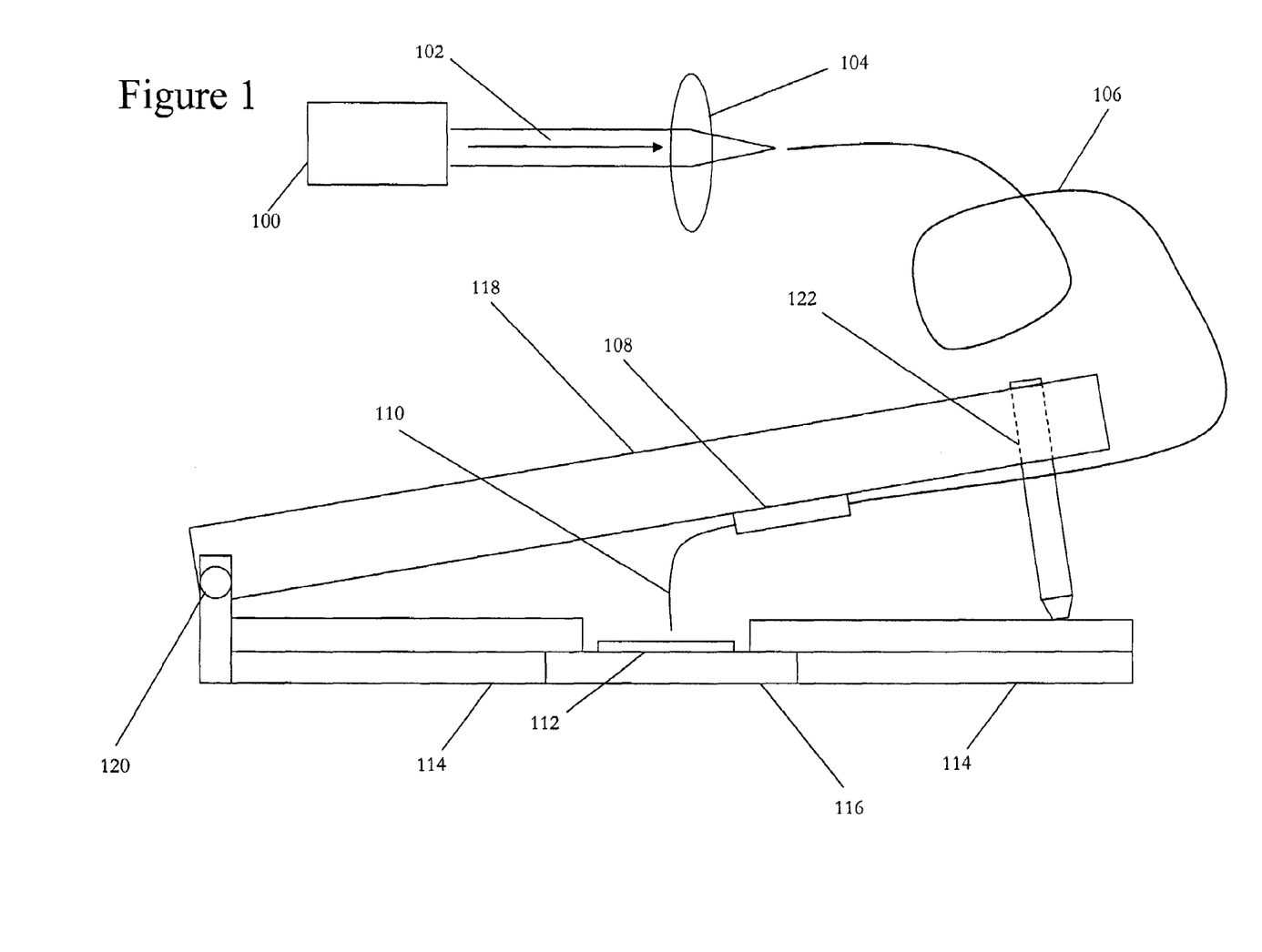
FIG. 1 is a block diagram of an exemplary NSOM laser micro-machining system that may be used to perform any of the exemplary methods of the present invention.

FIG. 1 illustrates a simplified block diagram of an exemplary NSOM laser micromachining system that may be used with the exemplary methods of the present invention. Quantum cellular automata, coupled quantum dot devices, resonant tunneling devices, multifunction optical arrays, diffractive optical elements, beam shapers, microlens arrays, optical diffusers, beam splitters, laser diode correctors, fine pitch gratings, photonic crystals, micro-electrical-mechanical systems, micro-circuitry, micro-surface-acoustic-wave devices, micro-mechanical oscillators, polymerase chain reaction microsystems, biochips for detection of hazardous chemical and biological agents, high-throughput drug screening and selection Microsystems, and molds to form other microstructures are examples of microstructures that may be machined by an exemplary NSOM laser micromachining system of the present invention.

As described below with reference to the exemplary methods of FIGS. 3 and 7, these microstructures may be efficiently manufactured or mass customized using such an exemplary system. This exemplary system includes laser source 100, optical fiber 106, NSOM probe holder 108, and NSOM probe 110 to generate and transmit pulses of laser light to workpiece 112, as well as lens 104 to couple optical beam 102 into optical fiber 106 and numerous NSOM components to position NSOM probe 110.

It is noted that an ultrafast laser source may desirably be used in the exemplary system of FIG. 1, but that longer pulsed, high energy lasers may be used as well. Ultrafast laser sources may provide significantly higher peak power levels than longer pulsed laser source (i.e. lasers with pulse durations>1 ns) and CW laser sources. These high peak powers may be desirable to help increase the fluence of laser light that is coupled through the probe tip into the near-field. Providing higher peak powers in NSOM probe 110 may allow the use of even smaller NSOM probe tips compared to the wavelength of ultrafast laser source 100, as may increasing the pulse energy of longer pulses.

In the exemplary system of FIG. 1, laser source 100 may desirably include any type of solid state gain medium typically used for laser machining applications, such as: Cr:YAG (peak fundamental wavelength, $\lambda_f$=1520 nm); Cr:Forsterite ($\lambda_f$=1230-1270 nm); Nd:YAG and Nd:YVO4 ($\lambda_f$=1064 nm); Nd:GdVO4 ($\lambda_f$=1063 nm); Nd:YLF ($\lambda_f$=1047 nm and 1053 nm); Nd:glass ($\lambda_f$=1047-1087 nm); Yb:YAG ($\lambda_f$=1030 nm); Cr:LiSAF ($\lambda_f$=826-876 nm); Ti:Sapphire ($\lambda_f$=760-820 nm); and Pr:YLF ($\lambda_f$=612 nm). These solid state gain media may be pumped using standard optical pumping systems such as flash lamp, erbium doped fiber lasers, and diode lasers, the output pulses of which may be directly coupled into the solid state gain medium or may undergo harmonic generation before being used to pump the solid state gain medium. The solid state gain medium (media) may be configured to operate as one or more of: a laser oscillator; a single pass amplifier; and/or a multiple pass amplifier. This element also includes optics to substantially collimate the laser light. Laser source 100 may desirably produce nearly Fourier-transform limited pulses. If an ultrafast laser source is desired these pulses may have a duration of less than about 1 ns, typically less than 20 ps. An additional, non-solid state, single or multiple pass amplifier such as a XeCl, KrF, ArF, or $F_2$ excimer amplifier (not shown) may be included to increase the output power of laser source 100. Alternatively, laser source 100 may include an excimer laser system (e.g. XeCl, $\lambda_f$=308 nm; KrF, $\lambda_f$=248 nm; ArF, $\lambda_f$=193 nm; or $F_2$, $\lambda_f$=157 nm), a dye laser system (e.g. 7-diethylamino-4-methylcoumarin, $\lambda_f$=435-500 nm; benzoic acid, 2-[6-(ethylamino)-3-(ethylimino)-2,7-dimethyl-3H-xanthen-9-yl]-ethyl ester, monohydrochloride, $\lambda_f$=555-625 nm; 4-dicyanmethylene-2-methyl-6-(p-dimethylaminostyryl)-4H-pyran, $\lambda_f$=598-710 nm; or 2-(6-(4-dimethylaminophenyl)-2,4-neopentylene-1,3,5-hexatrienyl)-3-methylbenzothiazolium perchlorate, $\lambda_f$=785-900 nm), or other laser system used in laser machining applications (e.g. $CO_2$, $\lambda_f$=10.6 μm).

It may be desirable for laser source 100 to have a peak wavelength of less than approximately 400 nm to improve near-field coupling through submicron probe tips. A harmonic generation crystal may be used within this component to reduce the peak wavelength of the pulses of laser light. Desirably, a frequency-doubled, 150 fs Ti:Sapphire laser (for example a Clark MXR CPA2000) may be used as laser source 100.

Additionally, laser source 100 may include optics to control the intensity, polarization, and/or collimation of its laser beam output. A polarization controller may be included to control the polarization of the pulses of laser light generated by laser source 100. These pulses may be desirably circularly polarized. A shutter and/or a variable attenuator may be included in laser source 100 as well. These components may be coupled to control circuitry of the NSOM (not shown) to control laser machining of features on the surface of microstructure preform 112.

The output of laser source 100 may be focused by lens 104 into optical fiber 106, which desirably has a fiber core formed of a waveguide material that has low absorptivity near the peak wavelength of the pulses of laser light. Optical fiber 106 may be a part of NSOM probe 110 and the cleaved end of optical fiber 106 may function as the input plane of NSOM probe 110. This may be desirable to reduce coupling losses in the system. In this embodiment, NSOM probe 110, including its optical fiber portion 106, is held in NSOM probe holder 108.

Alternatively, optical fiber 106 may be separate from NSOM probe 110. In this alternative embodiment, NSOM probe 110 may only extend from the probe tip into NSOM probe holder 108. Optical fiber 106 transmits the pulses of laser light to the NSOM probe 110 through an input plane at the end of NSOM probe 110. Both optical fiber 106 and NSOM probe 110 are held in NSOM probe holder 108. Optical fiber 106 and NSOM probe 110 are aligned to allow for low loss coupling of the pulses of laser light into the NSOM probe. The input plane of NSOM probe 110 is desirably a cleaved fiber end and has an input area approximately equal to a cross-sectional area of the cleaved end of optical fiber 106. NSOM probe holder 108 may include optics, such as a ball lens to assist in optically coupling optical fiber 106 and NSOM probe 110. It is noted that pulses of optical beam 102 may alternatively be coupled directly into NSOM probe 110 without the use of optical fiber 106 to reduce dispersion effects, but this may complicate alignment of the system.

NSOM probe 110 is formed in a substantially cylindrical shape. It is noted that, although a cross-sectional shape of this substantially cylindrical shape may desirably be similar to optical fiber 106 near the end of NSOM probe 110 that acts as the input plane, this is not necessary. The cross-sectional shape of NSOM probe 110 may desirably be circular or another elliptical shape, or alternatively may be another shape used for waveguides, such as rectangular, and may change in size or shape along its length. For example, the substantially cylindrical shape of NSOM probe 110 tapers near its tip end to produce the probe tip. Additionally, it is contemplated that the substantially cylindrical shape of NSOM probe 110 may include a bend along its axis, as shown in FIG. 1.

Figure 2:
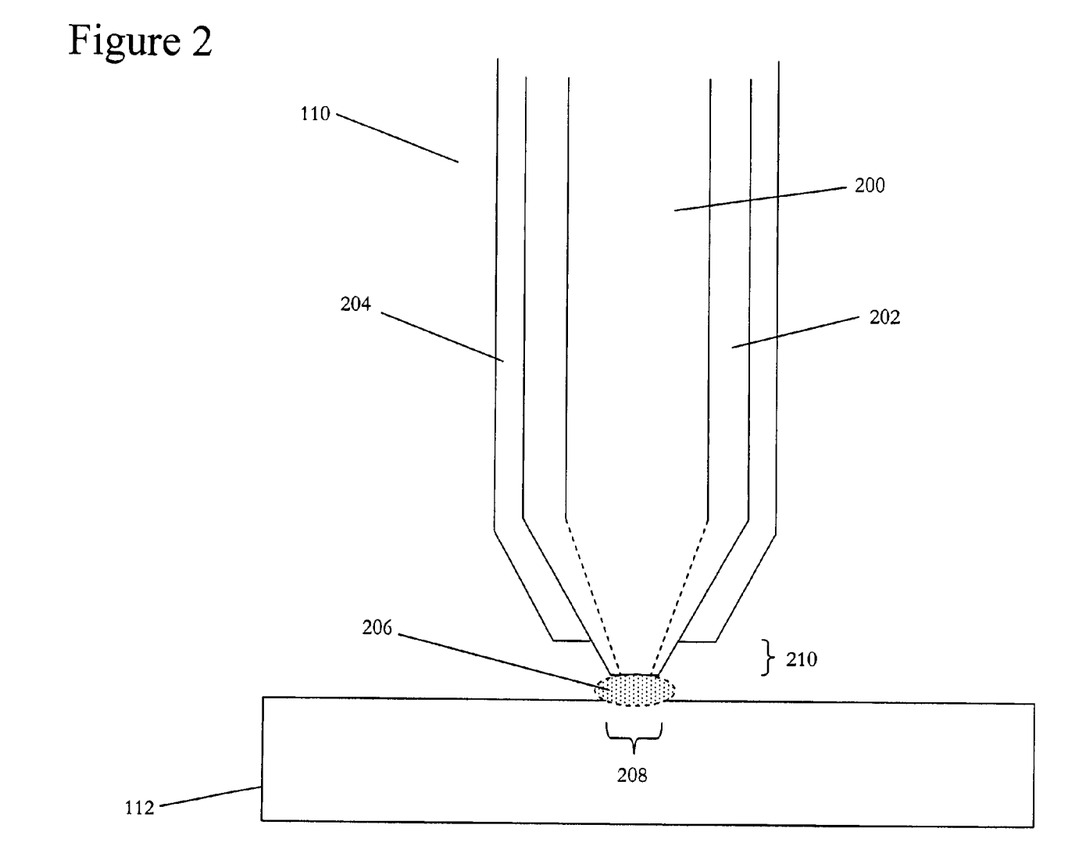
FIG. 2 is a side cut-away drawing of an exemplary NSOM probe that may be included in the exemplary system of FIG. 1 cut along a diameter of the exemplary NSOM probe.

FIG. 2 illustrates a close view of the tip end of exemplary NSOM probe 110. The end of the NSOM probe including the input plane is not shown in FIG. 2. Probe tip 210, which is located at the other end of NSOM probe 110 from the input plane, is shown. NSOM probe 110 includes a portion of optically transmissive core 200 and may also include a portion of cladding layer 202, as shown. In probe tip 210 the materials of optically transmissive core 200 and cladding layer 202 may be indistinguishable, illustrated by the dashed lines separating these materials in the tip region of the exemplary tip in FIG. 2. NSOM probe tip 210, from which near-field 206 emanates, may desirably have cross-sectional area of less than a square of the peak wavelength of the pulses of laser light and an elliptical cross-sectional shape, which allows machining of similar elliptical shapes with axes shorter than the peak wavelength in near-field irradiated area 208 of microstructure preform 112.

Optically transmissive core 200 desirably extends from the input plane to probe tip 210 and is optically coupled to laser source 100 through optical fiber 106 at the input plane. As with the fiber core of optical fiber 106, optically transmissive core 200 of NSOM probe 110 is formed of a material that has low absorptivity near the peak wavelength of the pulses of laser light and may desirably be formed of the same waveguide material. Cladding layer 202 desirably extends from the input plane to probe tip 210 to help confine the pulses of laser light within transmissive core 200, but may be omitted if sufficient confinement may occur without it.

Radiation confinement coating 204 is also formed on NSOM probe 110 and extends from adjacent to probe tip 210 along the side surface of the probe. Radiation confinement coating 204 provides additional confinement of the pulses of laser light in optically transmissive core 200 in sections of NSOM probe 110 that may otherwise be particularly leaky, such as the narrow section near probe tip 210 and any sections with a tight radius of curvature. Additionally, radiation confinement coating 204 substantially defines the area of probe tip 210, by its absence. It may extend as far as or to an opening adjacent to the input plane or may only extend a portion of that distance. In an exemplary embodiment in which the NSOM probe has a 90° bend it is desirable for radiation confinement coating 204 to extend at least around the bend. Radiation confinement coating 204 has high reflectivity near the peak wavelength of the pulses of laser light and desirably has low absorptivity in this band as well. It may include at least one metal and/or dielectric layer. It is further noted, that it may be desire for radiation confinement coating 204 to be substantially reflective to light that may be used for optically monitoring the position of NSOM probe 110.

Returning to FIG. 1, NSOM probe holder 108 is coupled to an NSOM mount to controllably hold and position NSOM probe 110. The NSOM mount also controllably holds and positions microstructure preform 112 relative to NSOM probe 110. The NSOM mount includes top support 118 which is connected to NSOM base 114 by hinge 120. This configuration allows NSOM probe 110 to be easily lifted away from microstructure preform 112 to allow inspection and/or replacement of the probe or mounting and dismounting of workpieces. Gross vertical, or Z, positioning of NSOM probe 110 over microstructure preform 112 may be accomplished using set screw 122 which may be coupled to a lead screw (not shown) or a stepper motor (not shown). The exemplary NSOM mount of FIG. 1 also includes workpiece positioning section 116 on which microstructure preform 112 is mounted. Workpiece positioning means 116 is coupled to NSOM base 114. It is noted that, although the exemplary embodiment of FIG. 1 includes workpiece positioning means 116 for positioning microstructure preform 112 relative to NSOM probe 110, one skilled in the art may understand that a positioning means to position NSOM probe 110 relative to microstructure preform 112 may be used in addition to, or in place of, workpiece positioning means 116.

Workpiece positioning means 116 may include, for example, a computer-controlled XYZ motion stage with micrometer resolution (for example, a micron resolution XYZ motion stage manufactured by Burleigh). A computer-controlled, piezo-electric XY motion stage with nanometer-resolution (for example, a piezo-electric XY motion stage manufactured by Queensgate) may also be included. Fine Z positioning may be accomplished using a piezo-electric Z motion stage in workpiece positioning means 116. These computer-controlled motion stages of workpiece positioning means 116 may be used to position the NSOM of the laser micro-machining system over the surface of microstructure preform 112, with the micrometer resolution XYZ motion stage providing coarse positioning and the piezo-electric motion stages providing fine positioning. Alternatively, other fine motion stages capable of nanometer resolution may be used to provide fine positioning.

The exemplary NSOM laser micromachining system of FIG. 1 also includes an NSOM control system. The exemplary NSOM control system may include NSOM probe monitors and NSOM controllers, which are coupled to the NSOM probe monitor, the piezo-electric XY motion stage, and the piezo-electric Z motion stage. The NSOM probe monitor determines the distance between probe tip 210 of the NSOM probe 110 and the surface of the microstructure preform 112.

The NSOM controller (not shown) uses this distance information to control the vertical position of either NSOM probe 110 or microstructure preform 112 (or both) by sending a signal to the Z motion stage(s), depending on which is coupled to the positioning means. The NSOM controller also controls the horizontal position of either NSOM probe 110 or microstructure preform 112 by sending a signal to the XY motion stage(s) based on the feature to be laser machined on the surface of microstructure preform 112. The NSOM controller may include circuitry or an ASIC, and may include a general purpose computer programmed to drive the motion stages in response to distance information from the NSOM probe monitor and input data regarding the feature to be machined on the surface of the microstructure workpiece.

The exemplary NSOM probe monitor desirably uses a cantilevered arm to couple NSOM probe holder 108 to NSOM top support 118. NSOM top support 118 is substantially rigid, while the cantilevered arm may move a calibrated amount relative to NSOM top support 118 in a direction substantially normal to the surface of microstructure preform 112. This calibrated movement may result from flexing of the cantilevered arm or may be due to pivoting of cantilevered arm on the coupling (not shown) between the cantilevered arm and NSOM top support 118 in response to atomic force between probe tip 210 and the surface of microstructure preform 112. Alternatively, NSOM probe 110 may be periodically oscillated by an NSOM probe oscillator coupled to the cantilevered arm. The amplitude of this periodic oscillation of NSOM probe 110 is desirably small, in the range of 0 to 20 nm. Changes in one, or both, of the period or amplitude of this periodic oscillation of NSOM probe 110 may provide the calibrated movement for the probe monitor.

The exemplary NSOM probe monitor may use an optical sensing method in which light is reflected directly off of radiation confinement coating 204. A light source is coupled to substantially rigid top support 118 as is an optical detector that includes at least two optical regions. The light source produces a substantially collimated beam of light that is reflected off of radiation confinement coating 204 and is then detected by the optical detector. As NSOM probe 110 moves up and down in response to atomic force between probe tip 210 and the surface of microstructure preform 112, the cantilevered arm either flexes or pivots, changing the angle of incidence of the substantially collimated beam of light from the light source on radiation confinement coating 204. This changes the location at which the substantially collimated beam of light is incident of the optical detector. Cantilever flexing may also change the point of incidence which may further change the location at which the substantially collimated beam of light is incident of the optical detector. Additionally, possible flexing of NSOM probe 110 due to atomic force may be detected as well. The multiple detector regions allow the optical detector to generate a signal based on an amount of light detected by each detector region. Processing means in the NSOM controller receive this detector signal and may determine the distance between the probe tip of the NSOM probe and the surface of the microstructure workpiece based on the amount of light detected by each detector region of the optical detector. This distance determination by the processing means may involve determining and indicating that the distance between the probe tip of the NSOM probe and the surface of the microstructure workpiece is greater than or less than a desired distance, or may alternatively provide a calibrated distance reading.

Another exemplary NSOM probe monitor uses an alternative optical sensing method in which light is reflected off of a reflective planar surface that is coupled to the cantilevered arm. Alternatively, the exemplary NSOM probe monitor may be based another means of detecting the atomic force on the NSOM probe. Any means that is used in atomic force microscopes may be used in the present invention. For example, a tuning fork method may be used in which the resonance frequencies of a matched pair of tuning forks are compared. One tuning fork is coupled to the NSOM probe so that forces on the probe may affect the resonance frequency of the tuning fork. Differences in the resonance frequencies of the tuning forks may then be correlated to atomic force on the NSOM probe.

Figure 3:
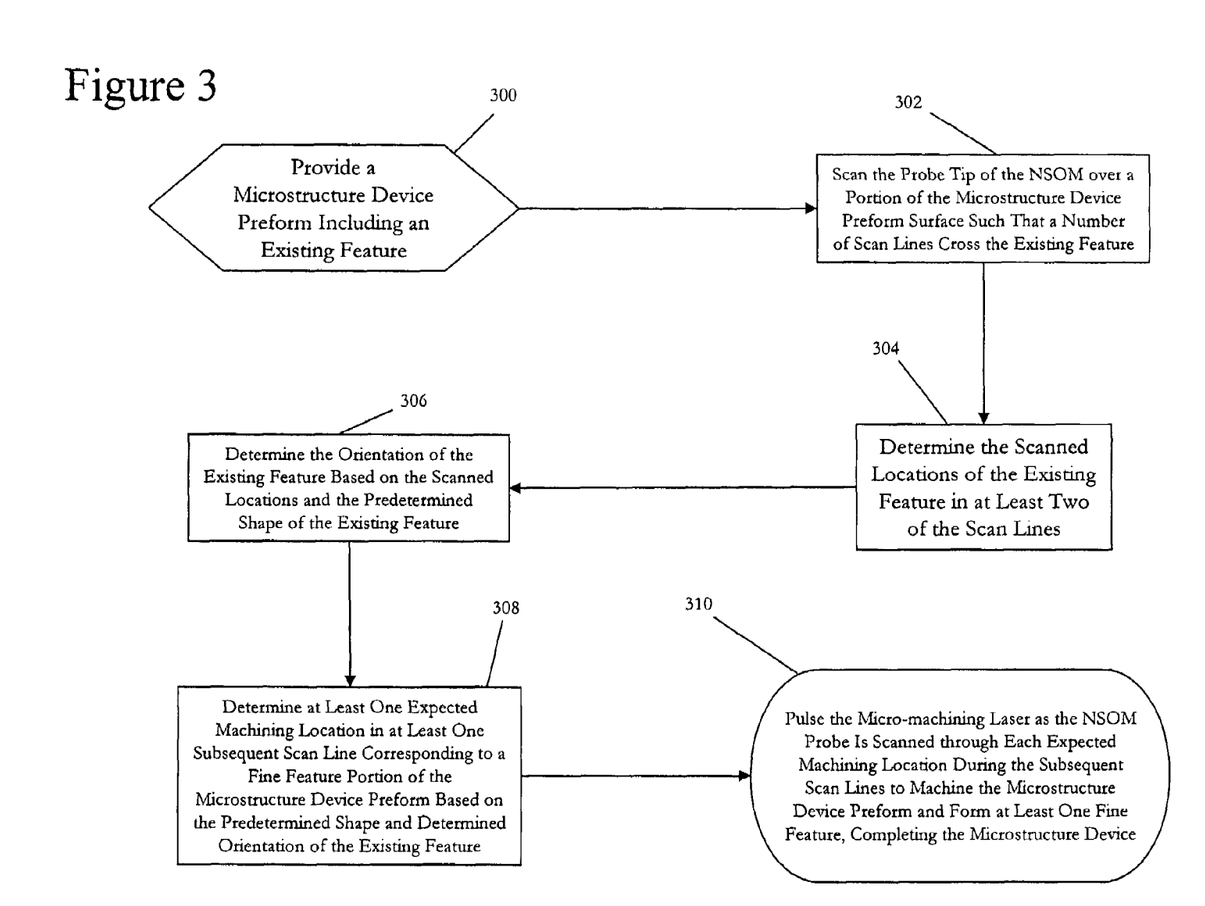
FIG. 3 is a flow chart illustrating an exemplary method of laser machining a fine feature on an existing feature of a microstructure device preform according to the present invention.

FIG. 3 illustrates an exemplary method for manufacturing a microstructure device, which includes at least one an existing feature having a predetermined shape on its top surface, using an NSOM laser micromachining system according to the present invention. An additional fine feature may be formed on the microstructure device using scan lines over the existing feature to determine machining locations according to the exemplary method of FIG. 3. The existing feature may have submicron dimensions. The microstructure devices to be manufactured using this exemplary method may be any of a number of microstructure devices including, for example: microstructure molds; quantum cellular automata; coupled quantum dot devices; resonant tunneling devices; multifunction optical arrays; diffractive optical elements; beam shapers; microlens arrays; optical diffusers; beam splitters; laser diode correctors; fine pitch gratings; photonic crystals; micro-electrical-mechanical systems; micro-circuitry; polymerase chain reaction microsystems; biochips for detection of hazardous chemical and biological agents; high-throughput drug screening and selection microsystems; micro-surface-acoustic-wave devices; and micro-mechanical oscillators.

The NSOM laser micromachining system includes an NSOM and a micro-machining laser, as in exemplary NSOM laser micromachining system of FIG. 1, which may be used to perform this exemplary method. The micro-machining laser may desirably be an ultrafast laser, a pulsed solid state laser, a pulsed dye laser, a pulsed microchip laser, a pulsed $CO_2$ laser, or a pulsed excimer laser.

Figure 4:
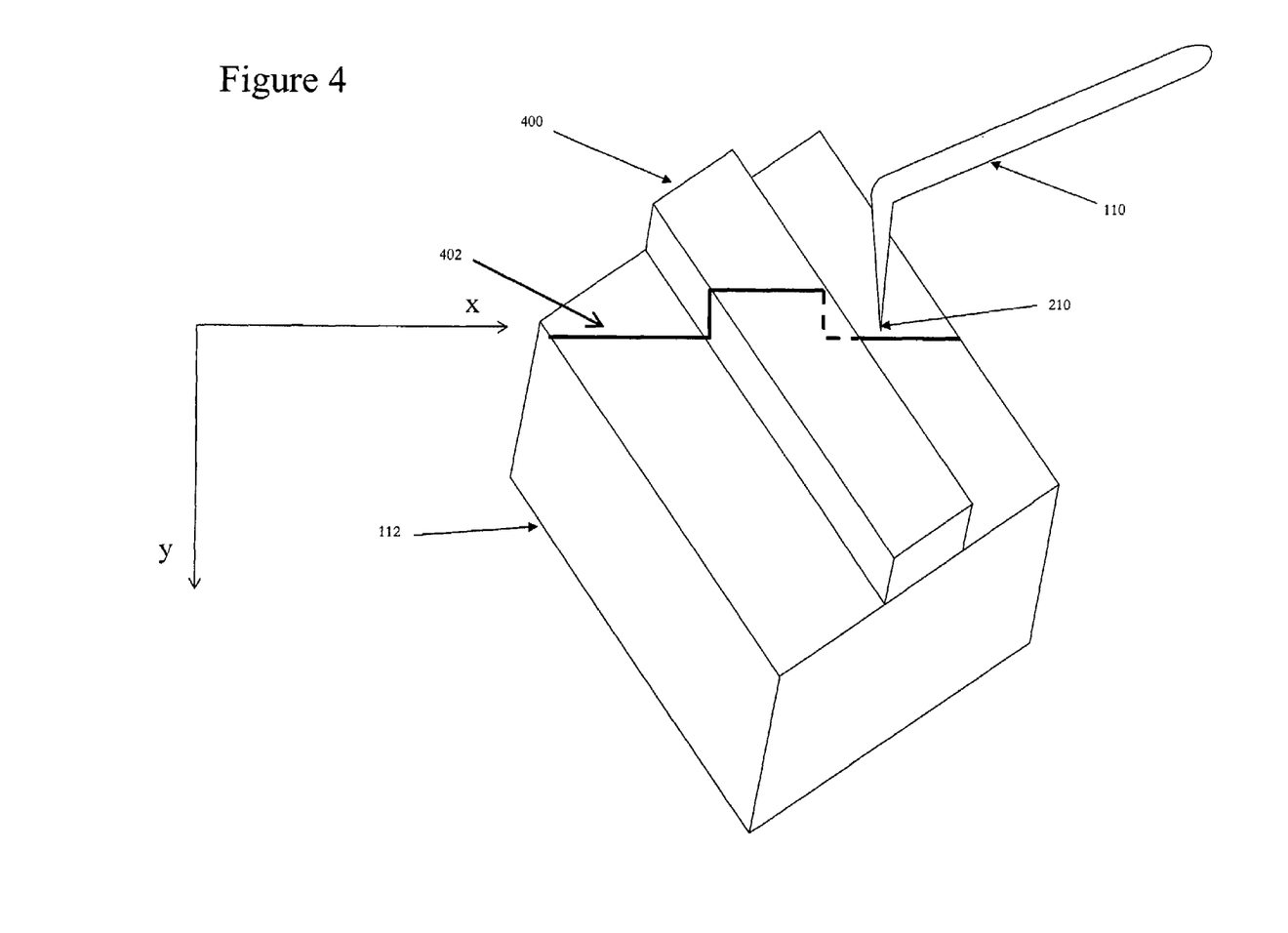
FIG. 4 is a perspective plan drawing of scanning of an exemplary waveguide structure to be machined according to the present invention.
Figure 5:
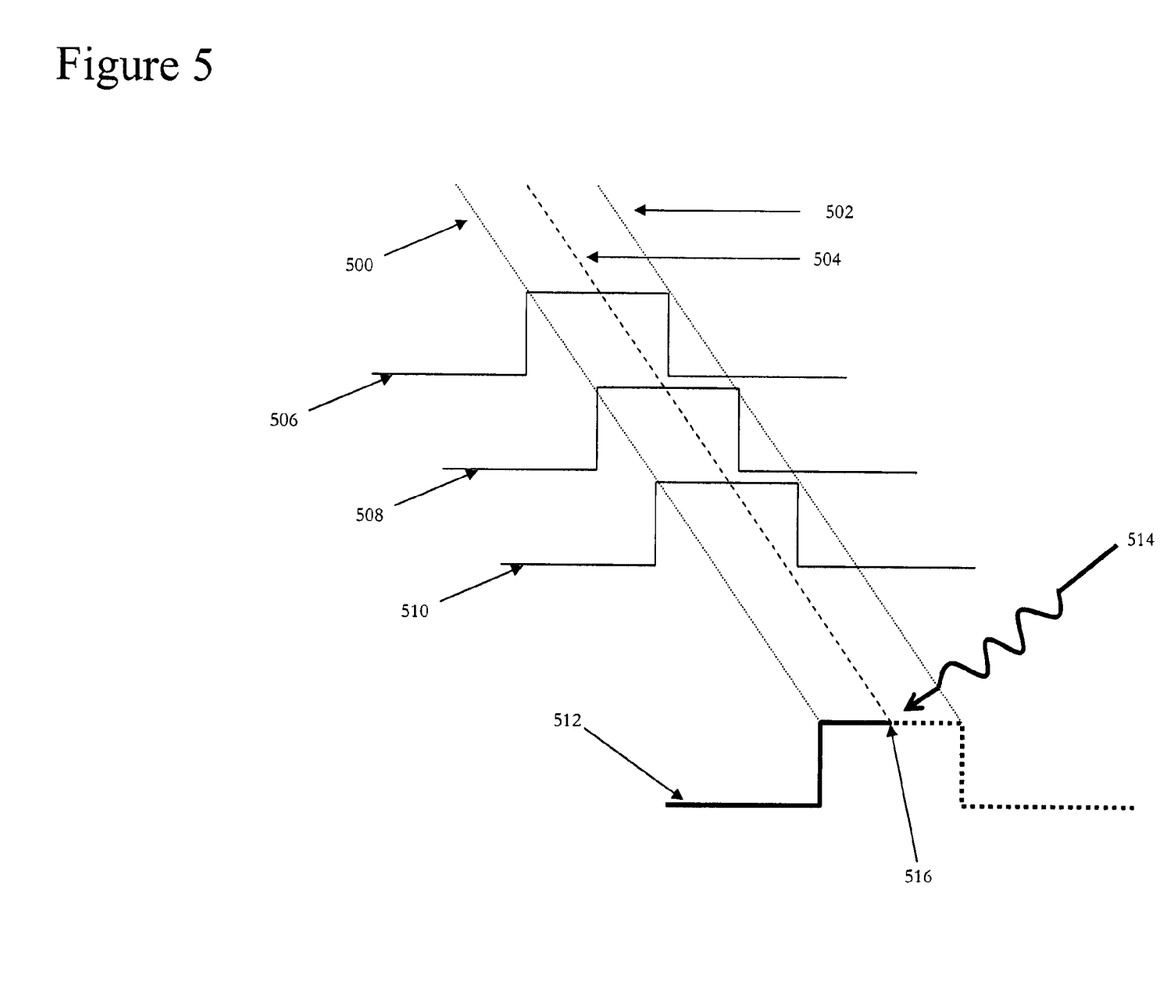
FIG. 5 is a schematic drawing illustrating a number of exemplary scan lines of the exemplary waveguide structure of FIG. 4.
Figure 6:
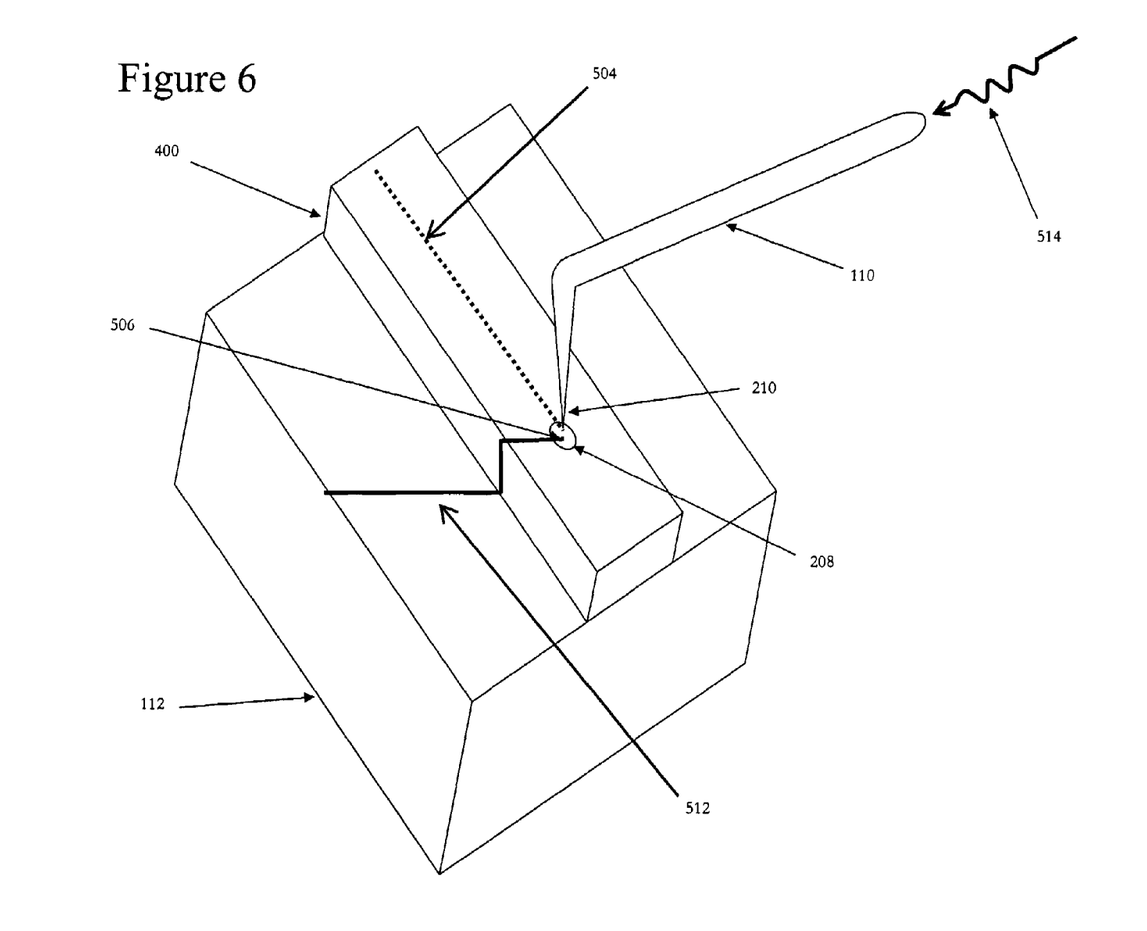
FIG. 6 is a perspective plan drawing of an exemplary one dimensional waveguide photonic crystal being machined according to the present invention.

Microstructure device preform 112, which includes an existing feature on its top surface, is provided, step 300. This preform is mounted in the NSOM. A portion of the top surface of the microstructure device preform is scanned with the NSOM to produce a number of scan lines, step 302. This scanning is accomplished by moving the probe tip of the NSOM in a scanning pattern relative to the top surface of microstructure device preform 112, while maintaining a substantially constant height. Exemplary scanning means are described in detail below. FIG. 4 illustrate exemplary microstructure preform 112 in which existing feature 400 is a waveguide. NSOM probe 10 is scanned along scan line 402 such that probe tip 210 is maintained at a substantially constant height about the surface of microstructure preform 112. The choice of a waveguide as the existing in FIGS. 4-6 is merely to simplify its illustration and is not limiting. Additionally, it is noted that the existing feature need not be a functional portion of the microstructure, but may be a calibration mark with a known position relative to the microstructure(s) on the microstructure device preform.

The portion of the top surface to be scanned is selected such that the resulting scan lines cross over the existing feature. One exemplary method to select the top surface portion to be profiled involves optically imaging the top surface of the microstructure device preform to produce an optical image of the preform. This may be performed with a digital camera focused on the top surface. The optical image may desirably include NSOM probe 110 or other parts of the NSOM to act as reference points. An area of the top surface that includes the existing feature may be identified from the optical image. To identify the general area of surface that includes the existing feature, the optical image does not need submicron resolution, even though the feature to be identified may have submicron dimensions. Other indicia, such as the edges of microstructure device preform 112 may be used to identify the desired area in the optical image.

Probe tip 210 of the NSOM is then aligned over a point along one edge of the selected portion of the top surface of microstructure device preform 112, for example the upper left hand corner of the portion. The distance between probe tip 210 of NSOM probe 110 and a surface of microstructure device preform 112 at this starting point is determined. This distance may desirably be determined by detecting the atomic force between probe tip 210 and the surface as described above with reference to the exemplary laser micro-machining system of FIG. 1.

The distance between probe tip 210 and the surface of the microstructure device preform 112 is then controlled to be substantially equal to a desired scanning height. The desired scanning height is based on a number of factors including the size of probe tip 210, the roughness of the surface to be scanned, the peak power of the pulses of laser light to be used for machining of the surface, their peak wavelength, and the type of machining to be accomplished, but is desirably in the range of up to about half of the wavelength of the pulses of light used for machining the surface. The distance between probe tip 210 of NSOM probe 110 and the surface of the microstructure device preform 112 is desirably controlled using a piezo-electric, or other fine motion, Z motion stage to control a vertical position of either the NSOM probe or the microstructure device preform. The amount of drive voltage applied to the motion stage is based on the distance between probe tip 210 and the surface of microstructure preform 112 at the given point. It is desirable that the distance between probe tip 210 and the surface of microstructure device preform 112 be controlled with a tolerance of less than 5 nm.

The probe tip is scanned over the selected portion of the top surface by moving either NSOM probe 110 or microstructure device preform 112. The distance between probe tip 210 and the top surface is repeatedly measured and the vertical position of either NSOM probe 110 or microstructure device preform 112 is controlled to maintain the separation substantially equal to the scanning height. The scanning of probe tip 210 over the selected portion of the top surface may be performed in a raster scan pattern, where the probe tip is moved relative the selected portion of the top surface along a scan line direction (the X-direction) to a second edge of selected portion to form a first scan line. The probe tip is then moved relative to the microstructure device preform a predetermined line step distance in a direction substantially perpendicular to the scan line direction (the Y-direction) and moved back over the selected portion of the top surface along the scan line direction back to the first edge to form another scan line. The probe tip is again moved the line step distance in the direction substantially perpendicular to the scan line direction and the process is repeated until the entire selected portion of the surface has been scanned. Alternatively, after the probe tip has been moved along the first scan line, the probe tip may be moved the line step distance in the Y direction and rapidly returned to the first edge of the selected portion of the top surface so that all scan lines are scanned in the same direction, rather than back and forth. The line step distance is the distance between scan lines which is desirably substantially smaller than the minimum Y distance between machining locations. The line step distance may desirably be less than one tenth of the width of the probe tip of the NSOM, preferably less that one sixtieth of the width of the probe tip.

It is also possible that, as the probe tip is scanned at a first predetermined speed back and forth across the selected portion of the surface in the scan line direction, the probe tip may be slowly scanned in the perpendicular direction, so that the scan lines form a zigzag pattern over the selected portion of the top surface. If this method is used it may be desirable for the Y distance covered during the time it takes for two scan lines to be scanned to be less than one half of a width of the probe tip of the NSOM.

The scanned locations of the existing feature within at least two scan lines are determined, step 304. It is noted that, the topographical information of the top surface used to determine these scanned locations is based on the vertical movement needed to maintain the distance between probe tip 210 and microstructure device preform 112, correlated to the X and Y direction positions during the acquisition of the scan lines. Therefore, these scanned locations include X, Y, and Z coordinates that are scaled, at least initially, in terms of settings of the NSOM motion stages. This scaling may be desirable to allow simplified estimation of the position of probe tip 210 above the top surface of microstructure device preform 112 during subsequent scan lines.

FIG. 5 illustrates a number of scan lines 506, 508, 510, and 512 across an exemplary waveguide structure. If these scan lines are thought of as progressing from left to right, then dotted lines 500 and 502 may be seen as representing the rising and falling edges, respectively of waveguide 400 (i.e. the existing feature), as shown in FIG. 4. The sections of scan lines 506, 508, 510, and 512 between dotted lines 500 and 502 are therefore the scanned locations of the existing feature in this example. It may be desirable to determine indicia of the scanned locations such as the lengths of the scanned locations and/or the centers of the scanned locations, shown as dashed line 504 in FIG. 5. FIG. 6 illustrates a perspective drawing of this example showing center line 504 of waveguide 400. Unless otherwise calibrated, these scanned locations may be represented in terms of settings of the motion stages of the NSOM.

Based on the scanned location, or related indicia, and the known shape of the existing feature, the orientation of the existing feature is determined, step 306. For example, as shown in FIGS. 5 and 6, from the scanned locations of waveguide 400 found in scan lines 506, 508, and 510, it is possible to determine the orientation of waveguide 400. Once the orientation of the existing feature has been determined, one or more expected machining locations in subsequent scan lines for machining the fine feature may be determined, step 308. The expected machining location(s) may be determined based on the known shape of the existing feature, the known location of the fine feature relative to the existing feature, and the orientation of the existing feature determined in step 306. For example, as shown in FIGS. 5 and 6, from the scanned locations of waveguide 400 in scan lines 506, 508, and 510, it is possible to determine expected machining location 516 of a lattice point in the exemplary one dimensional photonic crystal in subsequent scan line 512. This exemplary expected machining location falls along centerline 504 of waveguide 400.

It is noted that new scanned locations may be determined with each new scan line. This increased knowledge may allow for the continuing improvement of the determined orientation of the existing feature and the expected machining location(s) as the scanning of the selected portion of the surface continues.

As the NSOM probe is scanned through the subsequent scan lines, the micro-machining laser is pulsed whenever probe tip 210 is over one of the expected machining locations, step 510. FIGS. 5 and 6 illustrate pulse 514 being transmitted through NSOM probe 110 to expected machining location 516 in subsequent scan line 512. The surface of the microstructure is machined to form a fine feature in near field irradiated 208, as probe tip 210 passes over during scan line 512. Because of the short duration of ultrafast laser pulses, it is unnecessary to stop the motion of the probe tip during this machining process. Also because the scan lines are desirably spaced less than one tenth of the width of probe tip 210, pulses fired during several successive scan lines may overlap significantly allowing multiple machining pulses to be fired in essentially the same location.

Laser source 100 is used to generate pulses of laser light. A harmonic generating crystal may be used to produce pulses of laser light having a shorter peak wavelength from the initial pulses of laser light generated by laser source 100. Additionally, an attenuator may be included in laser source 100 to control the fluence of the pulses of laser light, producing pulses of laser light having a predetermined near-field machining fluence. A polarization controller adjusts the polarization of the pulses to be substantially circular. The resulting pulses of laser light are coupled into NSOM probe 110.

As shown in FIG. 2, once the distance between probe tip 210 and the surface of microstructure preform 112 has been set to the desired machining distance in step 308 and the pulses of laser light are coupled into NSOM probe 110 in step 310, a near-field mode portion 206 of these pulses of laser light is transmitted through probe tip 210 of the NSOM probe and is evanescently coupled onto near-field irradiated area 208 of the surface of microstructure device preform 112. This causes near-field irradiated area 208 to be laser machined by near-field mode portion 206. Near-field irradiated area 208 desirably mimics the shape and size of probe tip 210 and corresponds to the horizontal location of probe tip 210. As described above with regard to FIG. 2, probe tip 210 desirably has an elliptical cross-sectional shape and a tip area less than a square of the peak wavelength of the pulses of laser light. Laser machining of near-field irradiated area 208 in step 310 includes: ablating workpiece material of the microstructure device preform in the near-field irradiated area; laser-assisted chemical vapor depositing deposition material on the surface of the microstructure device preform in the near-field irradiated area; exposing photoresist on the surface of the microstructure device preform in the near-field irradiated area; changing an index of refraction of workpiece material of the microstructure device preform in the near-field irradiated area; altering a lattice structure of workpiece material of the microstructure device preform in the near-field irradiated area; and changing a chemical composition of workpiece material of the microstructure device preform in the near-field irradiated area.

Once every expected machining location has been machined, then the laser machining of the fine feature is complete, and the completed microstructure device may be removed from the NSOM. Until then the selected portion of the top surface continues to be scanned. As noted above, this may be done by moving either NSOM probe 110 or microstructure device preform 112.

Laser source 100 desirably includes a laser oscillator to generate the pulses of laser light and a shutter to control emission of the pulses. The shutter is opened when probe tip 10 is being scanned over the expected machining location(s) where the fine feature is to be formed, thereby allowing laser machining of the fine feature, and closed when the probe tip is being scanned over other regions of the top surface, thereby preventing unwanted laser machining of these other scanned regions of the top surface of microstructure device preform 112.

It is noted that, if the microstructure device to be manufactured is a micro-mechanical oscillator, the resonance spectrum of the micro-mechanical oscillator may be tuned by the machining of the fine feature on the existing feature. In this case, the micro-mechanical oscillator may desirably be activated before machining and an initial resonance spectrum of the micro-mechanical oscillator determined. This initial resonance spectrum may then be compared to a desired resonance spectrum to determine a desired shape on the existing feature for a fine feature to tune the resonance spectrum of the micro-mechanical oscillator. Similarly, if the microstructure device to be manufactured is a photonic crystal, its transmission spectrum may tuned by machining a fine feature, or defect, in the regular pattern of the photonic crystal. The transmission spectrum of the photonic crystal is determined and compared to a desired transmission spectrum. A desired shape and location of the defect are then determined.

Figure 7:
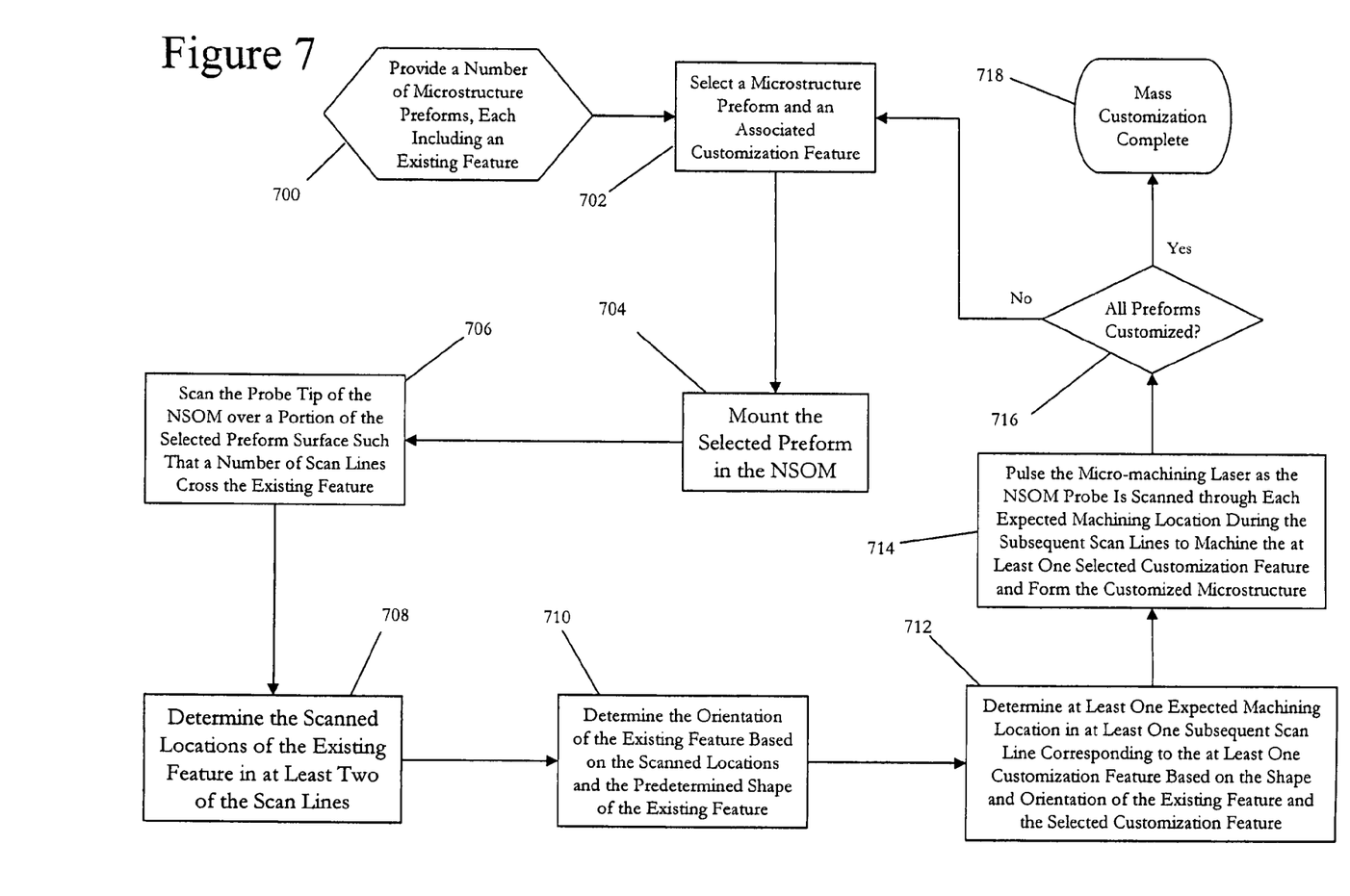
FIG. 7 is a flow chart illustrating an exemplary method of mass customizing a plurality of microstructure preforms according to the present invention.

FIG. 7 illustrates an exemplary method for mass customizing a plurality of microstructures with an NSOM laser micromachining system so that each microstructure has at least one of a predetermined set of customization features. The NSOM laser micromachining system, which includes an NSOM and a micro-machining laser, may be similar to the exemplary system of FIG. 1. Many steps of this exemplary method are similar to those of the exemplary method of FIG. 3 and may be performed the same way as described above with reference to FIG. 3.

A number of microstructure preforms are provided, step 700. Each microstructure preform includes an existing feature having a known shape on its top surface. The microstructures to be customized may include a number of different microstructures, such as: microstructure molds; quantum cellular automata; coupled quantum dot devices; resonant tunneling devices; multifunction optical arrays; diffractive optical elements; beam shapers; microlens arrays; optical diffusers; beam splitters; laser diode correctors; fine pitch gratings; photonic crystals; micro-electrical-mechanical systems; micro-circuitry; polymerase chain reaction microsystems; biochips for detection of hazardous chemical and biological agents; high-throughput drug screening and selection microsystems; micro-surface-acoustic-wave devices; and micro-mechanical oscillators.

One of the microstructure preforms is selected for customization, step 702, along with at least one customization feature from the predetermined set of customization features, which is to be machined on the existing feature of the top surface. The selected microstructure preform is mounted in the NSOM, step 704. As in the exemplary method of FIG. 3, a portion of the top surface of the selected microstructure preform is scanned with the NSOM to produce a number of scan line across the selected portion, step 706. This portion of the top surface is selected such that the resulting scan lines cross over the existing feature.

Scanned locations of the existing feature in at least two of the scan lines are determined, step 708. The orientation of the existing feature of the top surface of the selected microstructure preform is then determined based on the scanned locations and the known shape of the existing feature, step 710.

At least one expected machining location in one or more subsequent scan lines corresponding to customization feature(s) is determined, step 712, based on the predetermined shape of the existing feature, the selected customization feature(s), and the orientation of the existing feature determined in step 710. The micro-machining laser is then pulsed as the NSOM probe is scanned through the expected machining location(s) during subsequent scan lines, step 714, to machine the customization feature(s) selected in step 702 on the top surface of the microstructure device preform. This leads to a completed microstructure as in the exemplary method of FIG. 3 (and in the present exemplary case, the microstructure is customized).

It is determined whether all of the provided number of microstructure preforms have been customized, step 716. If they have all been customized then mass customization is complete, step 718. If not, then a new microstructure preform and associated customization feature(s) are selected, step 702, and steps 704, 706, 708, 710, 712, 714, and 716 are repeated for the newly selected microstructure preform until every microstructure preform provided in step 700 is customized.

The present invention includes exemplary methods to efficiently laser machine surfaces of a microstructure preform using near field radiation to manufacture and mass customize microstructures. The use of these exemplary methods allows greatly simplified, yet highly accurate, micro-machining in ambient atmosphere conditions. Such techniques may help to bring microstructures and nanotechnology into more common use. Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for manufacturing a microstructure device using a near field scanning optical microscope (NSOM) laser micromachining system including an NSOM and a micro-machining laser, the method comprising the steps of:
    a) providing a microstructure device preform including an existing feature having a predetermined shape on a top surface;
    b) scanning a probe tip of the NSOM over a portion of the top surface of the microstructure device preform such that a plurality of scan lines cross the existing feature;
    c) determining scanned locations of the existing feature in at least two of the plurality of scan lines;
    d) determining an orientation of the existing feature of the top surface of the microstructure device preform based on the scanned locations and the predetermined shape of the existing feature;
    e) determining at least one expected machining location in at least one subsequent scan line of the plurality of scan lines corresponding to a fine feature portion of the top surface of the microstructure device preform based on the predetermined shape of the existing feature and the orientation of the existing feature determined in step (d); and
    f) pulsing the micro-machining laser as the NSOM probe is scanned through the at least one expected machining location during the at least one subsequent scan line to machine the fine feature portion of the top surface of the microstructure device preform and form at least one fine feature on the top surface of the microstructure device preform, completing the microstructure device.

2. The method according to claim 1, wherein step (b) includes the steps of:
    b1) selecting the portion of the top surface of the microstructure device preform to be scanned;
    b2) aligning the probe tip of the NSOM over a point on a first edge of the selected portion of the top surface of the microstructure device preform;
    b3) determining a distance between the probe tip of the NSOM and the top surface of the microstructure device preform;
    b4) controlling the distance between the probe tip and the top surface such that the distance is substantially equal to a scanning height by moving one of the NSOM probe or the microstructure device preform in a vertical direction;
    b5) moving the probe tip over the selected portion of the top surface along a scan line direction to a second edge of selected portion while repeating steps (b3) and (b4) to maintain the distance between the probe tip and the top surface substantially equal to the scanning height;
    b6) moving the probe tip a predetermined line step distance in a direction substantially perpendicular to the scan line direction;
    b7) moving the probe tip over the selected portion of the top surface along the scan line direction back to the first edge of selected portion while repeating steps (b3) and (b4) to maintain the distance between the probe tip and the top surface substantially equal to the scanning height;
    b8) moving the probe tip a predetermined line step distance in the direction substantially perpendicular to the scan line direction; and
    b9) repeating steps (b5), (b6), (b7), and (b8) until the plurality of scan lines are scanned.

3. The method according to claim 2, wherein step (b1) includes the steps of:
    b1a) optically imaging the top surface of the microstructure device preform to produce an optical image;
    b1b) identifying an area of the top surface that includes the existing feature from the optical image;
    b1c) selecting the area identified in step (b1b) as the portion of the top surface to be scanned.

4. The method according to claim 2, wherein the step of determining the distance between the probe tip and the top surface of the microstructure device preform includes detecting an atomic force between the probe tip and the top surface.

5. The method according to claim 2, wherein the step of controlling the distance between the probe tip and the top surface of the microstructure device preform includes using a Z motion stage to control a vertical position of one of the NSOM probe or the microstructure device preform based on the distance between the probe tip and the top surface determined in step (b3).

6. The method according to claim 2, wherein:
the scanning height is in a range of up to half of a peak wavelength of light generated by the micro-machining laser; and
the distance between the probe tip of the NSOM and the top surface of the microstructure device preform is controlled in step (b4) with a tolerance of less than 5 nm.

7. The method according to claim 2, wherein the predetermined line step distance is less than about one tenth of a width of the probe tip of the NSOM.

8. The method according to claim 1, wherein step (b) includes the steps of:
b1) selecting the portion of the top surface of the microstructure device preform to be scanned;
b2) aligning the probe tip of the NSOM over a point on a first edge of the selected portion of the top surface of the microstructure device preform;
b3) determining a distance between the probe tip of the NSOM and the top surface of the microstructure device preform;
b4) controlling the distance between the probe tip and the top surface such that the distance is substantially equal to a scanning height by moving one of the NSOM probe or the microstructure device preform in a vertical direction;
b5) moving the probe tip over the selected portion of the top surface along a scan line direction to a second edge of selected portion while repeating steps (b3) and (b4) to maintain the distance between the probe tip and the top surface substantially equal to the scanning height;
b6) moving the probe tip a predetermined line step distance in a direction substantially perpendicular to the scan line direction and rapidly returning the probe tip of the NSOM to the first edge of the selected portion of the top surface; and
b7) repeating steps (b5) and (b6) until the plurality of scan lines are scanned.

9. The method according to claim 8, wherein step (b1) includes the steps of:
b1a) optically imaging the top surface of the microstructure device preform to produce an optical image;
b1b) identifying an area of the top surface that includes the existing feature from the optical image;
b1c) selecting the area identified in step (b1b) as the portion of the top surface to be scanned.

10. The method according to claim 8, wherein the step of determining the distance between the probe tip and the top surface of the microstructure device preform includes detecting an atomic force between the probe tip and the top surface.

11. The method according to claim 8, wherein the step of controlling the distance between the probe tip and the top surface of the microstructure device preform includes using a Z motion stage to control a vertical position of one of the NSOM probe or the microstructure device preform based on the distance between the probe tip and the top surface determined in step (b3).

12. The method according to claim 8, wherein:
the scanning height is in a range of up to half of a peak wavelength of light generated by the micro-machining laser; and
the distance between the probe tip of the NSOM and the top surface of the microstructure device preform is controlled in step (b4) with a tolerance of less than 5 nm.

13. The method according to claim 8, wherein the predetermined line step distance is less than about one tenth of a width of the probe tip of the NSOM.

14. The method according to claim 1, wherein:
step (b) includes the steps of:
b1) selecting the portion of the top surface of the microstructure device preform to be scanned;
b2) aligning the probe tip of the NSOM over a point on a first edge of the selected portion of the top surface of the microstructure device preform;
b3) determining a distance between the probe tip of the NSOM and the top surface of the microstructure device preform;
b4) controlling the distance between the probe tip and the top surface such that the distance is substantially equal to a scanning height by moving one of the NSOM probe or the microstructure device preform in a vertical direction;
b5) moving the probe tip back and forth over the selected portion of the top surface along a scan line direction between the first edge and a second edge of selected portion at a first predetermined speed while repeating steps (b3) and (b4) to maintain the distance between the probe tip and the top surface substantially equal to the scanning height;
b6) simultaneously moving the probe tip at a second predetermined speed in a direction substantially perpendicular to the scan line direction until the plurality of scan lines are scanned;
the second predetermined speed is substantially less than the first predetermined speed; and
during a time that two scan lines are scanned the probe tip is moved a predetermined line step distance in the direction substantially perpendicular to the scan line direction.

15. The method according to claim 14, wherein step (b1) includes the steps of:
b1a) optically imaging the top surface of the microstructure device preform to produce an optical image;
b1b) identifying an area of the top surface that includes the existing feature from the optical image;
b1c) selecting the area identified in step (b1b) as the portion of the top surface to be scanned.

16. The method according to claim 14, wherein the step of determining the distance between the probe tip and the top surface of the microstructure device preform includes detecting an atomic force between the probe tip and the top surface.

17. The method according to claim 14, wherein the step of controlling the distance between the probe tip and the top surface of the microstructure device preform includes using a Z motion stage to control a vertical position of one of the NSOM probe or the microstructure device preform based on the distance between the probe tip and the top surface determined in step (b3).

18. The method according to claim 14, wherein:
the scanning height is in a range of up to half of a peak wavelength of light generated by the micro-machining laser; and
the distance between the probe tip of the NSOM and the top surface of the microstructure device preform is controlled in step (b4) with a tolerance of less than 5 nm.

19. The method according to claim 14, wherein the predetermined line step distance is less than about one tenth of a width of the probe tip of the NSOM.

20. The method according to claim 1, wherein step (d) further includes the steps of;
  d1) determining lengths of the scanned locations of the existing feature of the top surface of the microstructure device preform in the at least two of the plurality of scan lines; and
  d2) determining center points of the scanned locations of the existing feature of the top surface of the microstructure device preform in the at least two of the plurality of scan lines relative to end points of the scan lines.

21. The method according to claim 1, wherein:
  the microstructure device is a one dimensional photonic crystal;
  the existing feature is a waveguide;
  step (d) includes determining center points of the scanned locations of the waveguide in the at least two of the plurality of scan lines relative to end points of the scan lines so that the center points of the scanned locations define a center line or the waveguide; and
  step (e) includes determining a plurality of expected machining locations in a plurality of subsequent scan lines corresponding to a plurality of lattice points in the one dimensional photonic crystal along the center line of the waveguide.

22. The method according to claim 1, wherein step (f) includes the steps of:
  f1) using the micro-machining laser to generate pulses of laser light as the probe tip is scanned through the at least one expected machining location determined in step (e);
  f2) coupling the pulses of laser light into the probe tip of the NSOM;
  f3) coupling a near-field mode portion of the pulses of laser light through the probe tip of the NSOM and onto the fine feature portion of the top surface of the microstructure device preform corresponding to the at least one expected machining location to machine the fine feature portion of the top surface of the microstructure device preform; and
  f4) continuing to scan the probe tip over the selected portion of the top surface of the microstructure device preform and repeating steps f1, f2, f3, and f4 until the microstructure device is completed.

23. The method according to claim 22, wherein:
  the micro-machining laser includes a laser oscillator to generate the pulses of laser light and a shutter to control emission of the pulses; and
  step (f1) includes the steps of:
    f1a) opening the shutter when the probe tip is scanned through the at least one expected machining location determined in step (e); and
    f1b) closing the shutter when the probe tip is in other sections of the plurality of scan lines.

24. The method according to claim 22, wherein:
  the micro-machining laser includes a laser oscillator and an attenuator; and
  step (f1) includes the steps of:
    f1a) using the laser oscillator to generate initial pulses of laser light having an initial fluence; and
    f1b) using the attenuator to control the fluence of the initial pulses of laser light, thereby producing the pulses of laser light having a predetermined near-field machining fluence.

25. The method according to claim 22, wherein:
  the micro-machining laser includes a laser oscillator and a polarization controller; and
  step (f1) includes the steps of:
    f1a) using the laser oscillator to generate initial pulses of laser light having an initial polarization; and
    f1b) using the polarization controller to adjust the initial polarization of the initial pulses of laser light to a substantially circular polarization.

26. The method according to claim 1, wherein machining the top surface of the microstructure device preform in step (f) includes at least one of:
  ablating device material of the microstructure device preform in the fine feature portion of the top surface of the microstructure device preform;
  laser-assisted chemical vapor depositing deposition material on the top surface of the microstructure device preform in the fine feature portion of the top surface of the microstructure device preform;
  exposing photoresist on the top surface of the microstructure device preform in the fine feature portion of the top surface of the microstructure device preform;
  changing an index of refraction of the device material of the microstructure device preform in the fine feature portion of the top surface of the microstructure device preform;
  altering a lattice structure of the device material of the microstructure device preform in the fine feature portion of the top surface of the microstructure device preform; or
  changing a chemical composition of the device material of the microstructure device preform in the fine feature portion of the top surface of the microstructure device preform.

27. The method according to claim 1, wherein the micro-machining laser is one of an ultrafast laser, a pulsed solid state laser, a pulsed dye laser, a pulsed microchip laser, a pulsed $CO_2$ laser, or a pulsed excimer laser.

28. The method according to claim 1, wherein the microstructure device to be manufactured is at least one of a microstructure mold, a quantum cellular automaton, a coupled quantum dot device, a resonant tunneling device, a multifunction optical array, a diffractive optical element, a beam shaper, a microlens array, an optical diffuser, a beam splitter, a laser diode corrector, a fine pitch grating, a photonlc crystal, a micro-electrical-mechanical system, micro-circuitry, a polymerase chain reaction microsystem, a biochip for detection of hazardous chemical and biological agents, a high-throughput drug screening and selection microsystem, a micro-surface-acoustic-wave device, or a micro-mechanical oscillator.

29. The method according to claim 1:
  wherein the microstructure device to be manufactured is a micro-mechanical oscillator;
  whereby a resonance spectrum of the micro-mechanical oscillator is tuned by the at least one fine feature machined on the top surface of the microstructure device preform.

30. The method according to claim 1:
  wherein;
    the microstructure device to be manufactured is a photonic crystal; and
    the at least one fine feature to be machined is a defect;
  whereby a transmission spectrum of the photonic crystal is tuned by the defect.

31. The method according to claim 30, wherein:
  step (a) includes the steps of;
    a1) determining the transmission spectrum of the photonic crystal;

a2) comparing the transmission spectrum determined in step (a1) to a predetermined transmission spectrum; and a3) determining a shape of the defect and a defect location based on the comparison in step (a2); and step (e) includes determining the at least one expected machining location to correspond to the shape and defect location determined in step (a3).

* * * * *